(12) United States Patent
Yang et al.

(10) Patent No.: US 7,663,397 B2
(45) Date of Patent: Feb. 16, 2010

(54) SEMICONDUCTOR DEVICE INCLUDING ON-DIE TERMINATION CONTROL CIRCUIT HAVING PIPE LINE VARYING WITH FREQUENCY RANGE

(75) Inventors: Jeong Suk Yang, Suwon-si (KR); Jin Ho Ryu, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 31 days.

(21) Appl. No.: 12/005,392

(22) Filed: Dec. 27, 2007

(65) Prior Publication Data

US 2008/0191734 A1    Aug. 14, 2008

(30) Foreign Application Priority Data

Feb. 9, 2007    (KR) .................... 10-2007-0013914

(51) Int. Cl.
H03K 17/16    (2006.01)
H03K 19/003   (2006.01)

(52) U.S. Cl. .............................. 326/30; 326/32; 326/33

(58) Field of Classification Search ............ 326/30, 326/32–34
See application file for complete search history.

(56) References Cited

U.S. PATENT DOCUMENTS

| 6,690,191 B2 * | 2/2004 | Wu et al. ............. 326/30 |
| 6,928,007 B2 * | 8/2005 | Jin ..................... 365/194 |
| 2005/0180229 A1 * | 8/2005 | Jin ..................... 365/194 |

FOREIGN PATENT DOCUMENTS

| KR | 1020040107594 A | 12/2004 |
| KR | 100604948 B1    | 7/2006  |
| KR | 1020060089357 A | 8/2006  |

* cited by examiner

*Primary Examiner*—Anh Q Tran
(74) *Attorney, Agent, or Firm*—Harness, Dickey & Pierce, P.L.C.

(57) ABSTRACT

A semiconductor device according to example embodiments that may include an on-die termination (ODT) control circuit having a pipe line structure which changes in response to a frequency of a clock signal and a termination resistance generator for generating termination resistance in response to a termination resistance control signal.

18 Claims, 8 Drawing Sheets

SEMICONDUCTOR DEVICE INCLUDING ON-DIE TERMINATION CONTROL CIRCUIT HAVING PIPE LINE VARYING WITH FREQUENCY RANGE

PRIORITY STATEMENT

This application claims priority under 35 U.S.C. §119 to Korean Patent Application No. 10-2007-0013914, filed on Feb. 9, 2007, in the Korean Intellectual Property Office, the entire contents of which are incorporated by reference.

BACKGROUND

1. Field

Example embodiments are directed to a semiconductor device, and for example, to a semiconductor device capable of changing a pipe line of an on-die termination control circuit for controlling termination resistance, and a method of operating the same.

2. Description of the Related Art

Operating speed, i.e., operating frequency of electronic devices, including semiconductor devices, may be increasing and the swing width of a signal interfaced for low-power operation may be decreasing. However, as the swing width of the signal decreases, influence of external noise may be increasing and there may be a problem in the reflectivity of the signal due to impedance mismatching at an interface terminal.

The impedance mismatching may occur due to variation in a process, variation in a voltage, and/or variation in temperature (PVT variation) as well as external noise. When impedance mismatching occurs, the interface signal may be distorted and transmitting data may become difficult. Bus termination technique may present an opportunity to reduce the distortion of the signal. The termination technique may include mother board termination and on-die termination (ODT). ODT may refer to impedance matching allowing bus termination to be accomplished at an input/output port of a semiconductor device.

Conventional semiconductor devices may include an ODT control circuit generating a termination resistance control signal in response to a first clock signal and a first ODT signal, a termination resistance generator generating termination resistance in response to the termination resistance control signal, and a data transceiver receiving/transmitting data from/to a data line which is impedance-matched to the terminal resistance.

The ODT control circuit may include a clock buffer, a delay-locked loop (DLL), an ODT buffer, and a control block. The clock buffer may buffer the first clock signal and generate a second clock signal. The DLL may generate a third clock signal synchronized with the first clock signal. The ODT buffer may buffer the first ODT signal and generate a second ODT signal. The control block may generate the terminal resistance control signal in response to the second clock signal, the third clock signal, and the second ODT signal.

FIG. 1 is a block diagram of a control block 100 that may be included in a conventional ODT control circuit. Referring to FIG. 1, the control block 100 may include a flip-flop 110, a pipe line circuit 120, a first repeater 130, a second repeater 140, and an ODT gate 150.

The flip-flop 110 may synchronize a second ODT signal BODT with a second clock signal BCLK so as to output a third ODT signal SODT. The pipe line circuit 120 may synchronize the third ODT signal SODT with a third clock signal DLL_CLK so as to output a fourth ODT signal SODT2.

The first repeater 130 may improve the current driving ability of the fourth ODT signal SODT2 so as to generate a fifth ODT signal D_SODT2. The second repeater 140 may improve the current driving ability of the third clock signal DLL_CLK so as to generate a fourth clock signal D_DLL_CLK. The ODT gate 150 may synchronize the fifth ODT signal D_SODT2 with the fourth clock signal D_DLL_CLK so as to generate a termination resistance control signal CSTR.

Since conventional semiconductor devices may receive an ODT signal using an ODT buffer, it may be difficult to secure a time margin in the semiconductor devices when higher-speed operation is required. For example, a termination resistance control signal may lag or lead a latency specification of a semiconductor device according to an operating frequency of the semiconductor device. Latency indicates a time period between when a semiconductor device receives a command from a controller and when the semiconductor device outputs a control signal for executing the command, which may be expressed with respect to a cycle of a clock signal.

As the operating frequency of a semiconductor device may be increasing and a path for transmitting a clock signal and a path for transmitting an ODT signal may have different latencies due to PVT variation, it may become more difficult to transmit a command with time margin secured with respect to a wider frequency range.

SUMMARY

Example embodiments are directed to a semiconductor device that may operate with a time margin with respect to a command in a wider frequency range by dividing an operating frequency range into a higher-frequency range and a lower-frequency range and changing an internal pipe line structure according to the frequency range. Example embodiments are also directed to a method of operating the semiconductor device.

Example embodiments show a semiconductor device that may include an on-die termination (ODT) control circuit and a termination resistance generator. The ODT control circuit may generate a termination resistance control signal in response to a first clock signal and a first ODT signal and may have a pipe line structure changing in response to a frequency of the first clock signal, for example. The termination resistance generator may generate termination resistance in response to the termination resistance control signal.

The ODT control circuit may include a clock buffer, a delay-locked loop, an ODT buffer, and a control block, for example. The clock buffer may buffer the first clock signal and output a second clock signal. The delay-locked loop may receive the first clock signal and output a third clock signal synchronized with the first clock signal. The ODT buffer may buffer the first ODT signal and output a second ODT signal. The control block may generate the termination resistance control signal based on the second clock signal, the third clock signal, and the second ODT signal, for example.

The control block may include a pipe line control signal generator, a first pipe line circuit, a second pipe line circuit, a first repeater, a second repeater, and a third pipe line circuit, for example. The pipe line control signal generator may generate a pipe line control signal based on the second clock signal and the third clock signal. The first pipe line circuit may receive the second ODT signal and the second clock signal, synchronize the second ODT signal with the second clock signal, and output a third ODT signal. The second pipe line circuit may output a fourth ODT signal based on the third clock signal, the third ODT signal, and the pipe line control signal and the second pipe line circuit may have a pipe line structure changing in response to the pipe line control signal, for example. The first repeater may enhance a current driving ability of the fourth ODT signal and generate a fifth ODT signal. The second repeater may enhance a current driving ability of the third clock signal and generate a fourth clock signal. The third pipe line circuit may receive the fifth ODT signal and the fourth clock signal and synchronize the fifth ODT signal with the fourth clock signal and generate the termination resistance control signal.

The pipe line control signal generator may include a frequency detection circuit and a first logical operator, for example. The frequency detection circuit may detect a frequency of the second clock signal and generate a frequency flag signal based on the detected frequency. The first logical operator may perform a logical operation on the third clock signal and the frequency flag signal so as to generate the pipe line control signal.

Example embodiments provide a method of operating a semiconductor device. The method may include generating a termination resistance control signal by changing a structure of a pipe line of an ODT control circuit in response to a frequency of a first clock signal and passing a first ODT signal through the changed pipe line. The method may include generating termination resistance in response to the termination resistance control signal.

Generating the termination resistance control signal may include buffering the first clock signal and outputting a second clock signal, and receiving the first clock signal and outputting a third clock signal synchronized with the first clock signal, for example. The method may also include buffering the first ODT signal and outputting a second ODT signal, and generating the termination resistance control signal based on the second clock signal, the third clock signal, and the second ODT signal.

Generating the termination resistance control signal based on the second clock signal, the third clock signal, and the second ODT signal may include generating a pipe line control signal based on the second clock signal and the third clock signal, receipt of the second ODT signal and the second clock signal, and outputting a third ODT signal by synchronizing the second ODT signal with the second clock signal, for example. Generating the termination resistance control signal may include outputting a fourth ODT signal based on the third clock signal, the third ODT signal, and the pipe line control signal, changing the pipe line structure in response to the pipe line control signal, and generating a fifth ODT signal by enhancing a current driving ability of the fourth ODT signal. Generating the termination resistance control signal may also include generating a fourth clock signal by enhancing a current driving ability of the third clock signal, receiving the fifth ODT signal and the fourth clock signal, and generating the termination resistance control signal by synchronizing the fifth ODT signal with the fourth clock signal.

Example embodiments of generating the pipe line control signal may include detecting a frequency of the second clock signal, generating a frequency flag signal based on the detected frequency, and generating the pipe line control signal by performing a logical operation on the third clock signal and the frequency flag signal.

Generating the frequency flag signal may include generating a fifth clock signal by delaying the second clock signal by a delay time, performing a logical operation on the second clock signal and the fifth clock signal, and inverting or latching a result of the logical operation on the second clock signal and the fifth clock signal in response to the second clock signal, for example. Generating the frequency flag signal may also include inverting or latching the inverted or latched result of the logical operation in response to the second clock signal.

Example embodiments of changing the pipe line structure may include latching or repeatedly inverting the third ODT signal or an output signal of a previous flip-flop in response to the pipe line control signal.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DESCRIPTION OF EXAMPLE EMBODIMENTS

Figure 1:
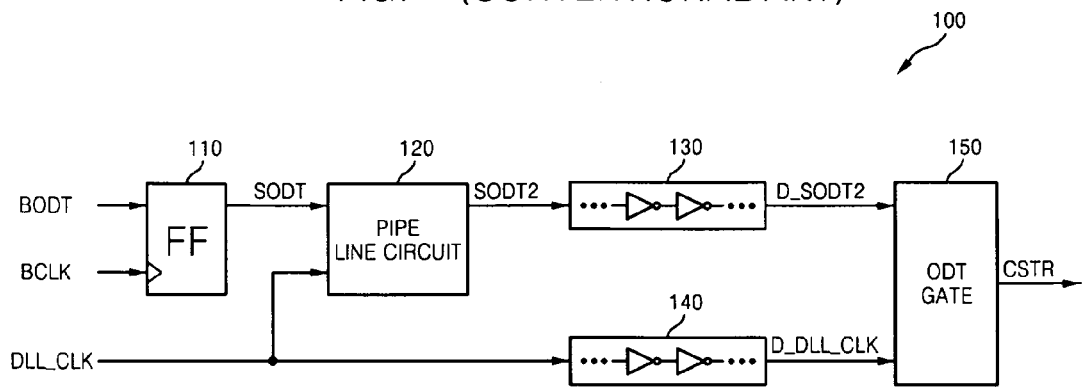
FIG. 1 is a block diagram of a control block included in a conventional on-die termination (ODT) control circuit.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used here in, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
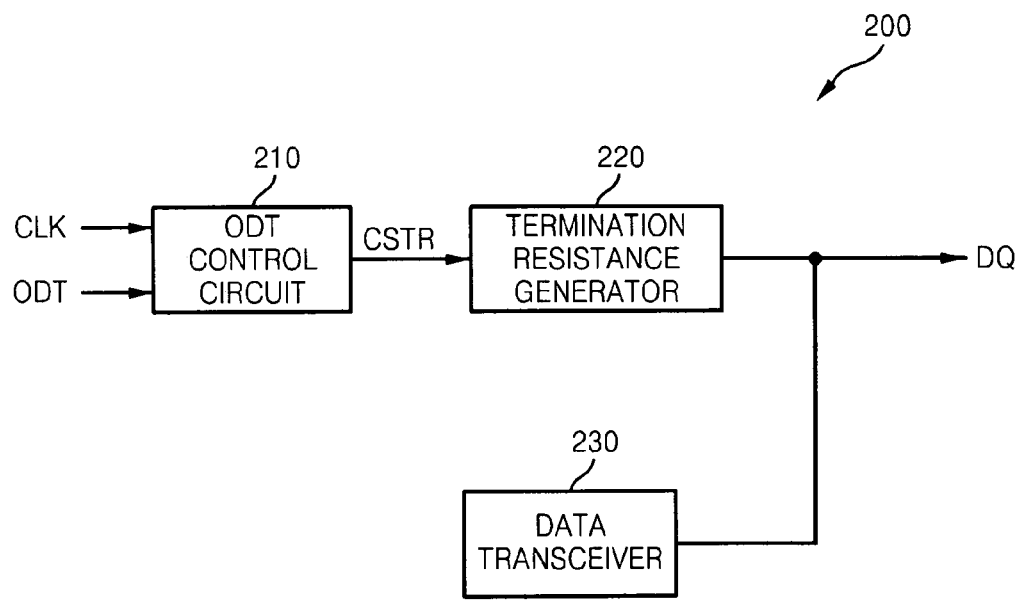
FIG. 2 is a block diagram of a semiconductor device according to example embodiments.

FIG. 2 is a block diagram of a semiconductor device 200 according example embodiments. The semiconductor device 200 may include an on-die termination (ODT) control circuit 210, a termination resistance generator 220, and a data transceiver 230, for example.

The ODT control circuit 210 may generate a termination resistance control signal CSTR in response to a first clock signal CLK and a first ODT signal ODT and may have a pipe line structure changing in response the frequency of the first clock signal CLK. The first ODT signal ODT may be a command received from a controller (not shown) and the termination resistance control signal CSTR may be a control signal for generating termination resistance.

The termination resistance generator 220 may generate termination resistance in response to the termination resistance control signal CSTR. The data transceiver 230 may receive and transmit data from and to a data line DQ which is impedance-matched to the termination resistance, for example.

Figure 3:
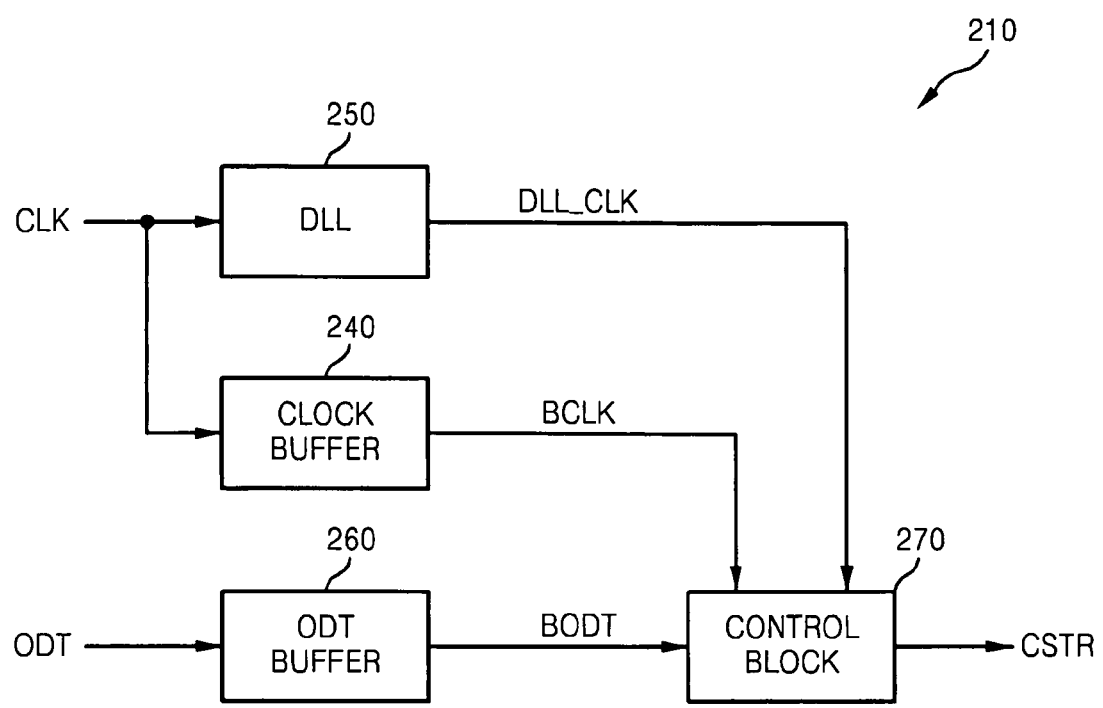
FIG. 3 is a block diagram of an ODT control circuit illustrated in FIG. 2 according to example embodiments.

FIG. 3 is a block diagram illustrating example embodiments of the ODT control circuit 210 shown in FIG. 2. In FIG. 3, the ODT control circuit 210 may include a clock buffer 240, a delay-locked loop (DLL) 250, an ODT buffer 260, and a control block 270, for example.

The clock buffer 240 may buffer the first clock signal CLK and output a second clock signal BCLK. The DLL 250 may receive the first clock signal CLK and output a third clock signal DLL_CLK synchronized with the first clock signal CLK.

The ODT buffer 260 may buffer the first ODT signal ODT and output a second ODT signal BODT. The control block 270 may generate the termination resistance control signal CSTR based on the second clock signal BCLK, the third clock signal DLL_CLK, and the second ODT signal BODT, for example.

Figure 4:
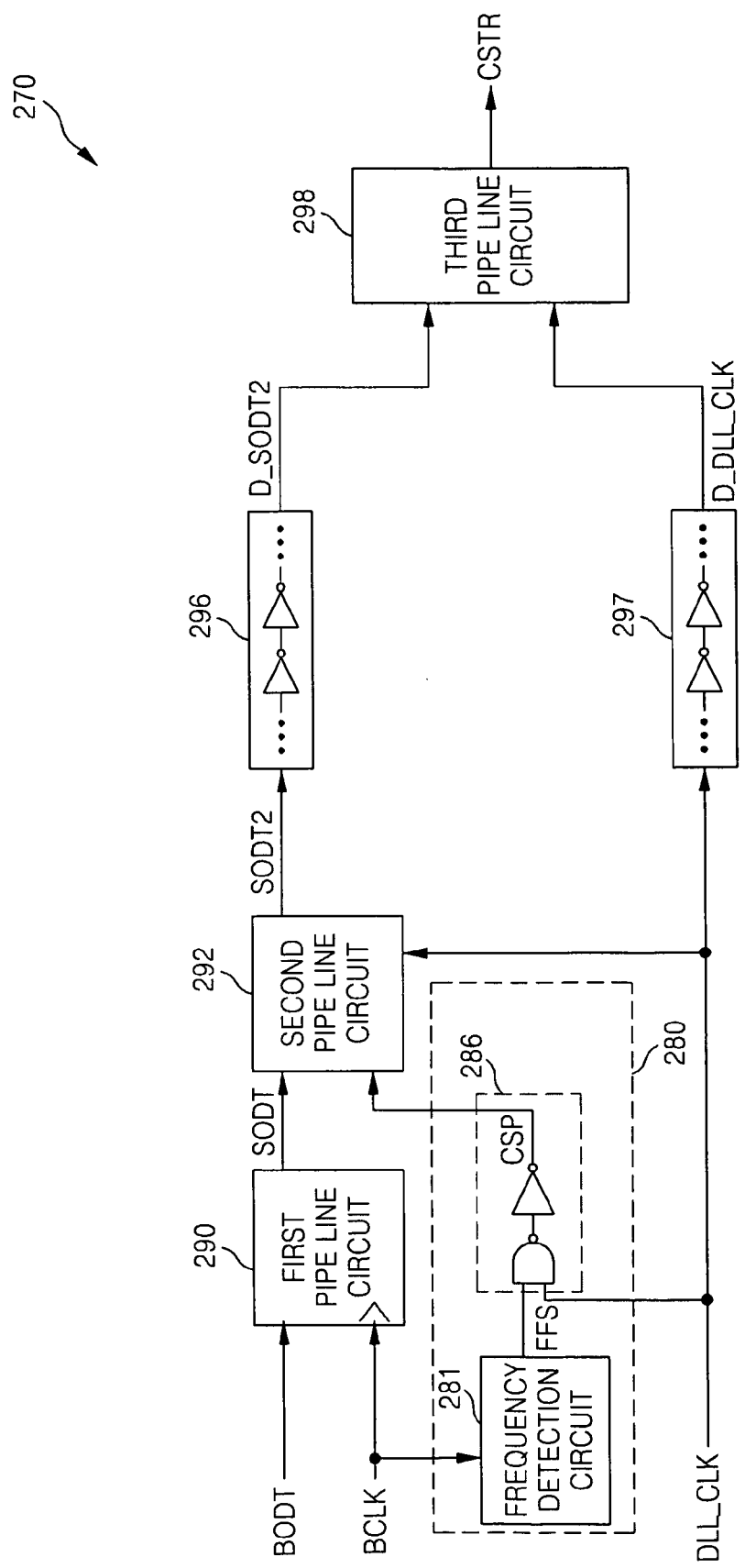
FIG. 4 is a block diagram of a control block included in an ODT control circuit according to example embodiments.

FIG. 4 is a block diagram illustrating example embodiments of the control block 270. In FIG. 4, the control block 270 may include a pipe line control signal generator 280, a first pipe line circuit 290, a second pipe line circuit 292, a first repeater 296, a second repeater 297, and a third pipe line circuit 298, for example.

Example embodiments show a reference frequency may be defined as a frequency that serves as the basis for dividing the frequency of the first clock signal CLK into a higher frequency and a lower frequency. A frequency higher than the reference frequency may be referred to as a higher frequency and a frequency lower than the reference frequency may be referred to as a lower frequency. The reference frequency may be set based on an actual driving frequency of a semiconductor device, for example.

Figure 5A:
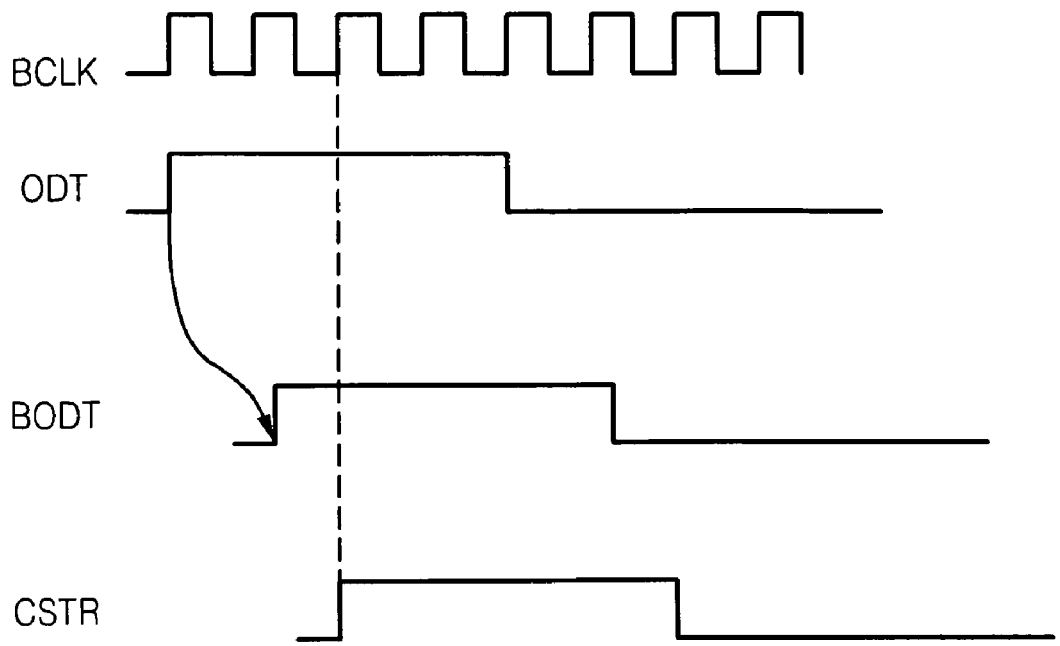
FIG. 5A is a timing chart of an ODT signal according to a path when a semiconductor device operates in a higher-frequency range according example embodiments.
Figure 5B:
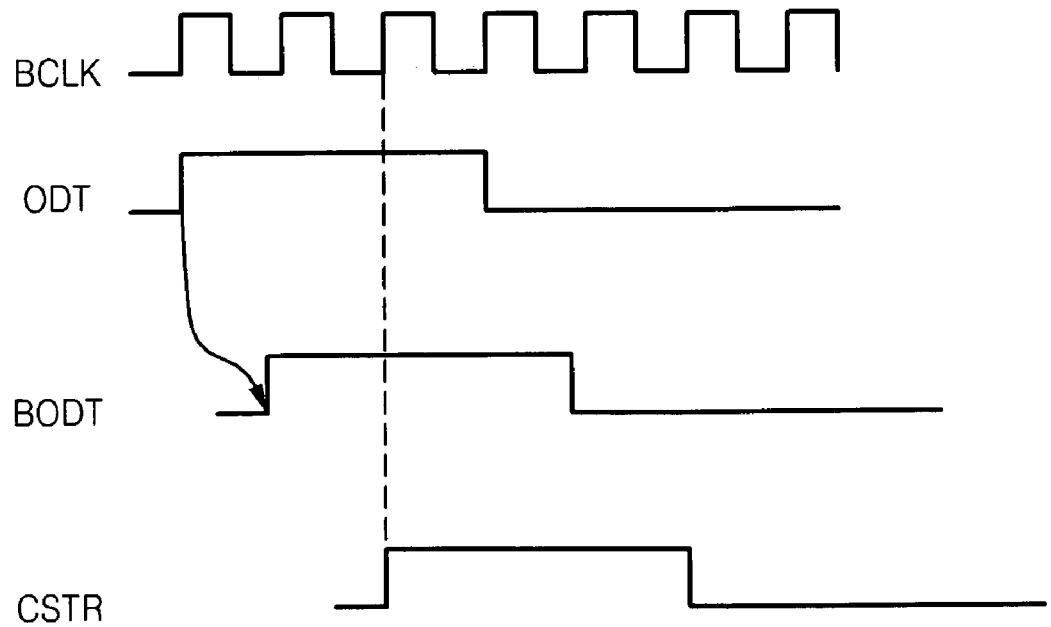
FIG. 5B is a timing chart of an ODT signal according to a path when a semiconductor device operates in a lower-frequency range according to example embodiments.

FIG. 5A is a timing chart depicting example embodiments of an ODT signal according to a path when the semiconductor device 200 operates in a higher-frequency range. FIG. 5B is a timing chart depicting example embodiments of an ODT signal according to a path when the semiconductor device 200 operates in a lower-frequency range. For example, FIGS. 5A and 5B may be timing charts of example embodiments of an ODT signal of a double data rate 2 (DDR2) having a latency of two clock cycles.

Referring to example embodiments shown in FIGS. 4 through 5B, a buffered ODT signal BODT may lag behind a buffered clock signal BCLK by a given period of time. For example, the termination resistance control signal CSTR output from the ODT control circuit 210 may have a constant latency of two clock cycles regardless of the frequency of the second clock signal BCLK.

The pipe line control signal generator 280 may generate a pipe line control signal CSP based on the second clock signal BCLK and the third clock signal DLL_CLK. The pipe line control signal generator 280 may include a frequency detection circuit 281 and a first logical operator 286. The frequency detection circuit 281 may detect the frequency of the second clock signal BCLK and generate a frequency flag signal FFS based on the detected frequency, for example. The first logical operator 286 may perform a logical operation on the third clock signal DLL_CLK and the frequency flag signal FFS and generate the pipe line control signal CSP.

Figure 6:
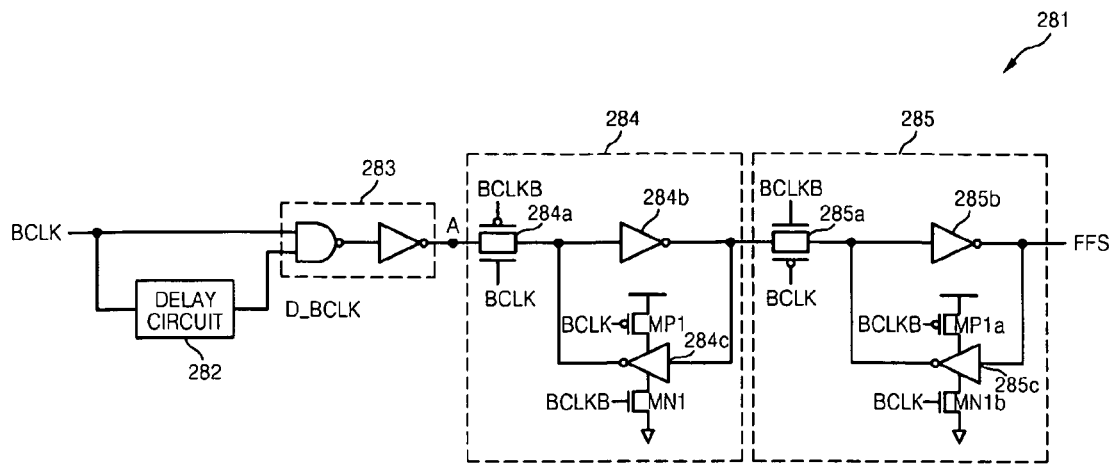
FIG. 6 is a circuit diagram of a frequency detection circuit illustrated in FIG. 4 according to example embodiments.

FIG. 6 shows a circuit diagram illustrating example embodiments of the frequency detection circuit 281 presented in FIG. 4. In FIG. 6, the frequency detection circuit 281 may include a delay circuit 282, a second logical operator 283, a third logical operator 284, and a fourth logical operator 285, for example.

Figure 7:
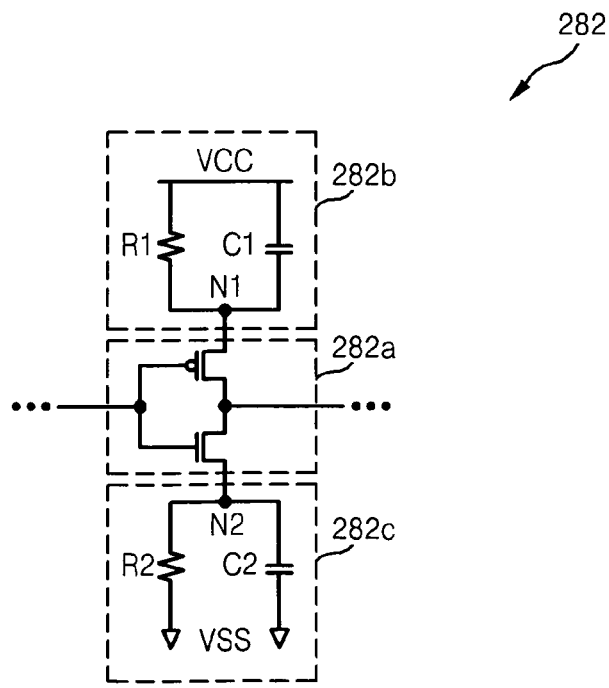
FIG. 7 is a circuit diagram of a delay circuit illustrated in FIG. 6 according to example embodiments.

The delay circuit 282 may delay the second clock signal BCLK by a delay time and generate a fifth clock signal D_BCLK. FIG. 7 is a circuit diagram showing example embodiments of the delay circuit 282 illustrated in FIG. 6. In FIG. 7, the delay circuit 282 may include a plurality of inverters 282a connected in series, for example. The inverters 282a may further include a first RC delay unit 282b and a second RC delay unit 282c. The delay time of the delay circuit 282 may be controlled by elements R1 and C1 included in the first RC delay unit 282b and elements R2 and C2 included in the second RC delay unit 282c.

The first RC delay unit 282b may be implemented by the resistor R1 and the capacitor C1 connected in parallel between a first power supply voltage line VCC and a first bias node N1 of one of the inverters 282a. The second RC delay unit 282c may be implemented by the resistor R2 and the capacitor C2, which are connected in parallel between a second power supply voltage line VSS and a second bias node N2 of the one of the inverters 282a. Whether the delay circuit 282 will be implemented by inverters alone or by inverters and RC delay units may be determined at the time of design.

The second logical operator 283 may perform a logical operation on the second clock signal BCLK and the fifth clock signal D-BCLK. The second logical operator 283 may include a NAND gate performing the logical operation on the second clock signal BCLK and the fifth clock signal D_BCLK and an inverter connected in series with an output terminal of the NAND gate, for example.

The third logical operator 284 may invert or latch an output signal of the second logical operator 283 in response to the second clock signal BCLK. An inverted second clock signal BCLKB may be obtained by inverting the phase of the second clock signal BCLK and may be provided by an inverter (not shown) for inverting the phase of the second clock signal BCLK. The third logical operator 284 may include a first switching element 284a and a first latch circuit 284b & 284c.

The fourth logical operator 285 may invert or latch an output signal of the third logical operator 284 in response to the second clock signal BCLK. The fourth logical operator 285 may include a second switching element 285a and a second latch circuit 285b & 285c.

Figure 8A:
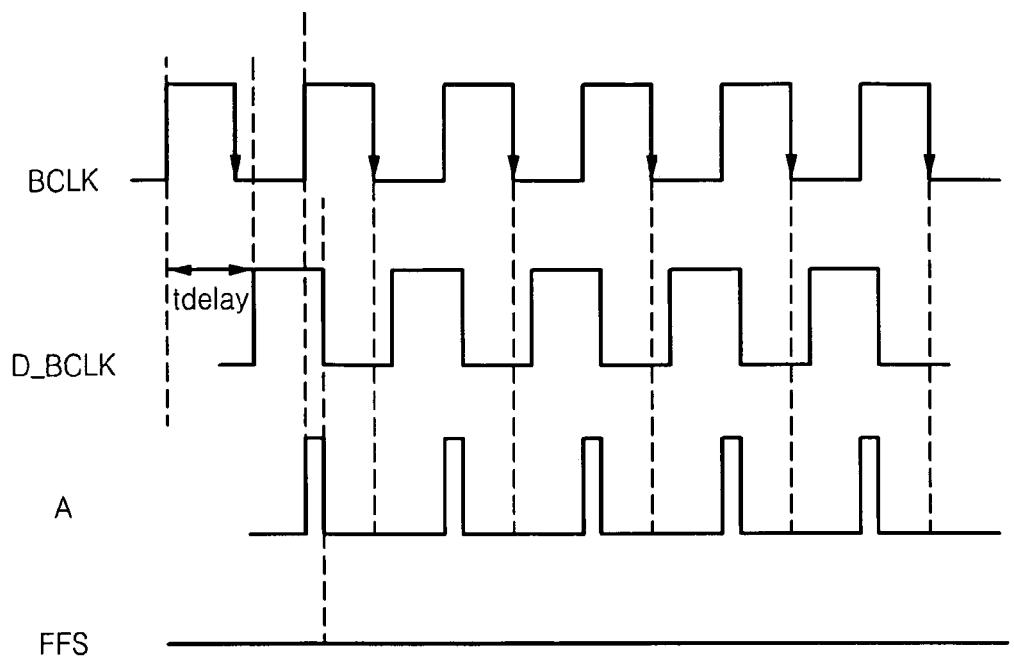
FIG. 8A is a timing chart illustrating the operation of the frequency detection circuit illustrated in FIG. 6 when a semiconductor device operates in a higher-frequency range according to example embodiments.
Figure 8B:
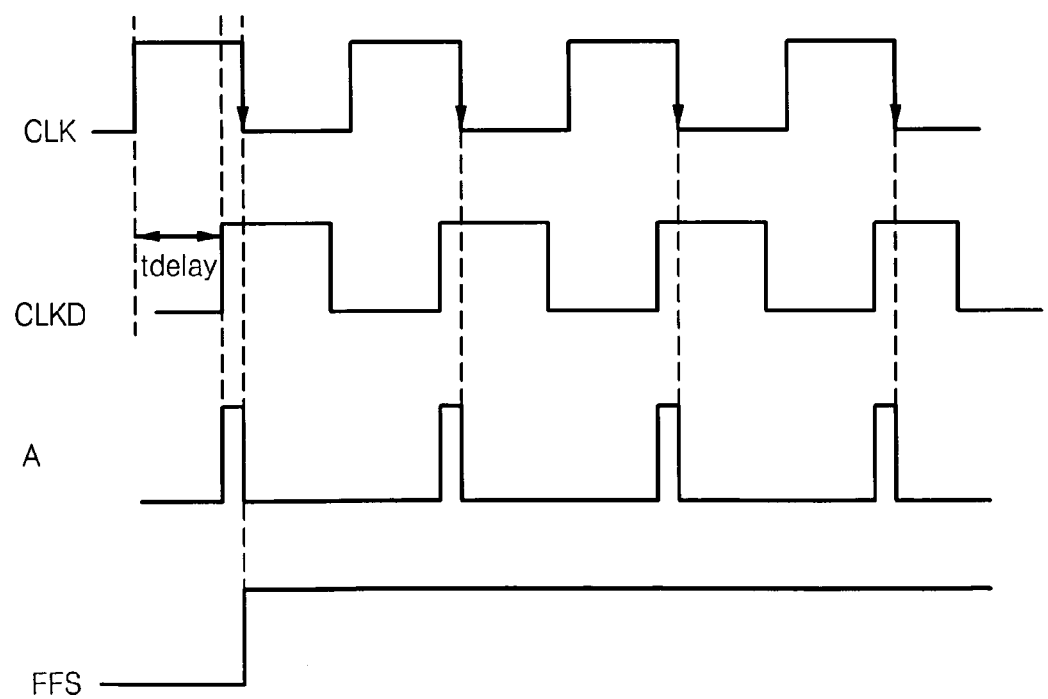
FIG. 8B is a timing chart illustrating the operation of the frequency detection circuit illustrated in FIG. 6 when a semiconductor device operates in a lower-frequency range according to example embodiments.

FIG. 8A shows example embodiments of a timing chart illustrating the operation of the frequency detection circuit 281 illustrated in FIG. 6 when the semiconductor device 200 operates in a higher-frequency range. FIG. 8B shows example embodiments of a timing chart illustrating the operation of the frequency detection circuit 281 illustrated in FIG. 6 when the semiconductor device 200 operates in a lower-frequency range. Example embodiments show a delay time "tdelay" of the fifth clock signal D_BCLK with respect to the second clock signal BCLK may be held constant at a given value, regardless of the frequency of the second clock signal BCLK. The second logical operator 283 may perform a NAND operation on the second clock signal BCLK and the fifth clock signal D_BCLK and may invert a signal resulting from the NAND operation and output a signal A.

The first switching element 284a of the third logical operator 284 may output the signal A only when the second clock signal BCLK is at a high level. When second clock signal BCLK is at a high level, transistors MP1 and MN1, which apply a bias voltage to the inverter 284c of the first latch circuit 284b & 284c, may be turned off. Consequently, the first latch circuit 284b & 284c may invert an output signal of the first switching element 284a. When the second clock signal BCLK is at a low level, the first switching element 284a may be opened and the first latch circuit 284b & 284c may latch the output signal of the first switching element 284a.

The second switching element 285a of the fourth logical operator 285 may output the output signal of the third logical operator 284 only when the second clock signal BCLK is at the low level. When second clock signal BCLK is at a low level, transistors MP1a and MN1b, which apply a bias voltage to the inverter 285c of the second latch circuit 285b & 285c, may be turned off. Consequently, the second latch circuit 285b & 285c may invert an output signal of the second switching element 285a. When the second clock signal BCLK is at the high level, the second switching element 285a may be opened and the second latch circuit 285b & 285c may latch the output signal of the second switching element 285a.

Referring to example embodiments shown in FIGS. 8A and 8B, the frequency detection circuit 281 may output the frequency flag signal FFS at a low level when the second clock signal BCLK is a higher-frequency signal and may output the frequency flag signal FFS at a high level when the second clock signal BCLK is a lower-frequency signal.

Referring to example embodiments shown in FIG. 4, the first logical operator 286 may include a NAND gate performing a NAND operation on the frequency flag signal FFS and the third clock signal DLL_CLK and an inverter inverting an output signal of the NAND gate. For example, when the second clock signal BCLK is the higher-frequency signal and the frequency flag signal FFS is at the low level, the pipe line control signal CSP is always at a low level. According to other example embodiments, when the second clock signal BCLK is the lower-frequency signal and the frequency flag signal FFS is at the high level, the pipe line control signal CSP may toggle based on the third clock signal DLL_CLK.

The first pipe line circuit 290 may receive the second ODT signal BODT and the second clock signal BCLK, synchronize the second ODT signal BODT with the second clock signal BCLK, and output a third ODT signal SODT. The first pipe line circuit 290 may be implemented by a flip-flop, for example.

The second pipe line circuit 292 may output a fourth ODT signal SODT2 based on the third ODT signal SODT, the pipe line control signal CSP, and the third clock signal DLL_CLK, and may have a pipe line structure changing in response to the pipe line control signal CSP, for example.

Figure 9:
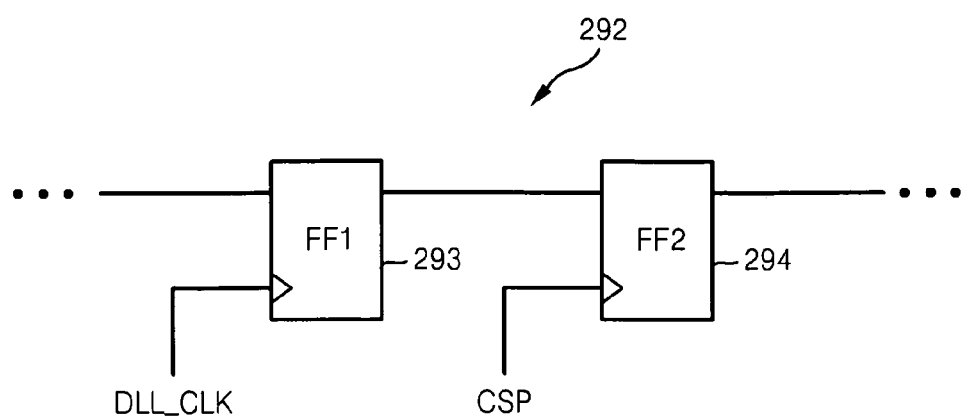
FIG. 9 is a circuit diagram of a second pipe line circuit illustrated in FIG. 4 according to example embodiments.

FIG. 9 is a circuit diagram illustrating example embodiments of the second pipe line circuit 292 shown in FIG. 4. In FIG. 9, the second pipe line circuit 292 may include at least one first flip-flop 293 and at least one second flip-flop 294, for example.

The first flip-flop 293 may latch the third ODT signal SODT or an output signal of a previous flip-flop in response to the third clock signal DLL_CLK. The first flip-flop 293 may operate in response to the third clock signal DLL_CLK toggling with a given period and may not change the pipe line structure of the second pipe line circuit 292. The structure and the operation of the first flip-flop 293 operating in response to the third clock signal DLL_CLK are obvious to those skilled in the art.

The second flip-flop 294 may latch or repeatedly invert the third ODT signal SODT or an output signal of a previous flip-flop in response to the pipe line control signal CSP.

Figure 10:
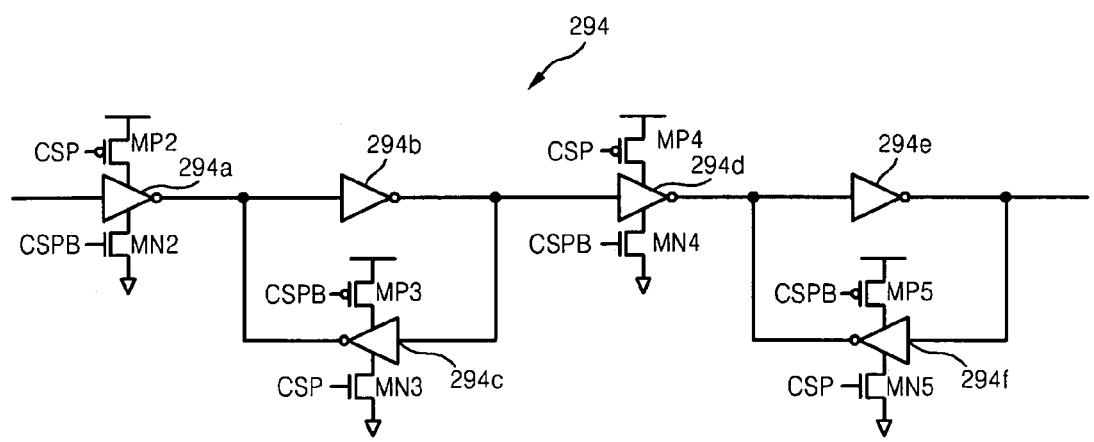
FIG. 10 is a circuit diagram of a second flip-flop illustrated in FIG. 9, according to example embodiments.

FIG. 10 is a circuit diagram illustrating example embodiments of the second flip-flop 294 shown in FIG. 9.

An inverted pipe line control signal CSPB may be obtained by inverting the phase of the pipe line control signal CSP. The inverted pipe line control signal CSPB may be provided by an inverter (not shown) for inverting the phase of the pipe line control signal CSP.

Example embodiments show that, when the second clock signal BCLK is the higher-frequency signal, the pipe line control signal CSP may be at a low level. Transistors MP2, MN2, MP4, and MN4 applying a bias voltage to a plurality of inverters 294a and 294d included in the second flip-flop 294 may be turned on. Transistors MP3, MN3, MP5, and MN5 applying a bias voltage to a plurality of inverters 294c and 294f included in the second flip-flop 294 may be turned off. Accordingly, the second flip-flop 294 may repeatedly invert the third ODT signal SODT or the output signal of the previous flip-flop using a plurality of inverters 294*a*, 294*b*, 294*d*, and 294*e*.

When the second clock signal BCLK is the lower-frequency signal, the pipe line control signal CSP may toggle in response to the third clock signal DLL_CLK, for example. Accordingly, the second flip-flop 294 may latch the third ODT signal SODT or the output signal of the previous flip-flop.

Example embodiments show the second pipe line circuit 292 may operate with a plurality of inverters when the second clock signal BCLK is the higher-frequency signal and may operate with a flip-flop when the second clock signal BCLK is the lower-frequency signal. Thus, example embodiments of the second pipe line circuit 292 may have a different pipe line structure according to the frequency of the second clock signal BCLK. The second pipe line circuit 292 may control a delay time of an ODT signal according to the second clock signal BCLK to obtain (e.g., secure) a time margin for the termination resistance control signal CSTR.

The first repeater 296 may enhance the current driving ability of the fourth ODT signal SODT2 and generate a fifth ODT signal D-SODT2. The first repeater 296 may be implemented by a plurality of inverters connected in series, for example.

The second repeater 297 may enhance the current driving ability of the third clock signal DLL_CLK and generate a fourth clock signal D_DLL_CLK. The second repeater 297 may be implemented by a plurality of inverters connected in series, for example.

According to example embodiments, the third pipe line circuit 298 may receive the fifth ODT signal D_SODT2 and the fourth clock signal D_DLL_CLK, synchronize the fifth ODT signal D_SODT2 with the fourth clock signal D_DLL_CLK, and generate the termination resistance control signal CSTR. Example embodiments provide that the third pipe line circuit 298 may synchronize the ODT signal D_SODT2 with the clock signal D_DLL_CLK. The third pipe line circuit 298 may be implemented by a plurality of flip-flops operating in response to the fourth clock signal D_DLL_CLK, for example.

Figure 11:
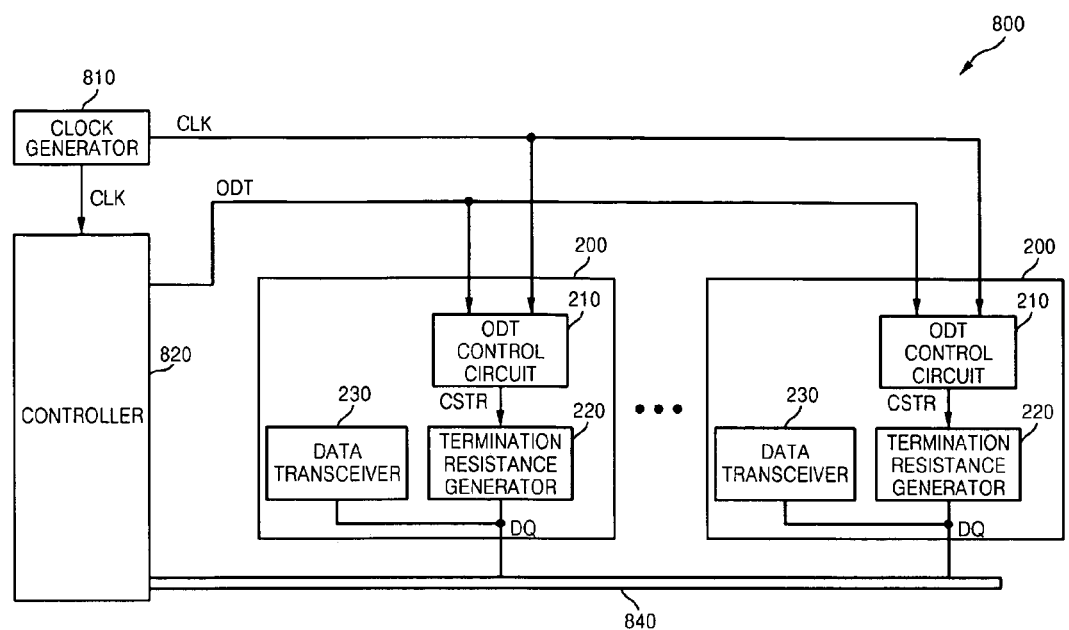
FIG. 11 illustrates a semiconductor system including a plurality of semiconductor devices according to example embodiments.

FIG. 11 illustrates example embodiments of a semiconductor system 800 that may include a plurality of semiconductor devices 200. In FIG. 11, the semiconductor system 800 may include a clock generator 810, a controller 820, a plurality of the semiconductor devices 200, and a data bus 840, for example.

The clock generator 810 may generate the first clock signal CLK. The controller 820 may generate the first ODT signal ODT based on the first clock signal CLK and control the operation of the data bus 840.

Each of the semiconductor devices 200 may include the ODT control circuit 210, the termination resistance generator 220, and the data transceiver 230. The ODT control circuit 210 may generate the termination resistance control signal CSTR in response to the first clock signal CLK and the first ODT signal ODT, and may have a pipe line structure changing in response to the frequency of the first clock signal CLK.

The termination resistance generator 220 may generate termination resistance in response to the termination resistance control signal CSTR. The data transceiver 230 may receive and transmit data from and to the data bus 840 via the data line DQ which is impedance-matched to the termination resistance, for example.

Example embodiments show a procedure in which a termination resistance control signal is generated based on an ODT signal. However, it is obvious to those skilled in the art that example embodiments of a control circuit as discussed herein may also be used with respect to other commands.

According to example embodiments, a semiconductor device may obtain (e.g., secure) a time margin between a clock signal and a command in a wider operating frequency range, which may allow execution of commands with the same latency in the wide operating frequency range.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A semiconductor device comprising:
an on-die termination (ODT) control circuit configured to generate a termination resistance control signal in response to a first clock signal and a first ODT signal; and
a termination resistance generator configured to generate termination resistance in response to the termination resistance control signal,
wherein the ODT control circuit includes,
a clock buffer configured to buffer the first clock signal so as to output a second clock signal,
a delay-locked loop configured to receive the first clock signal and to output a third clock signal synchronized with the first clock signal,
an ODT buffer configured to buffer the first ODT signal so as to output a second ODT signal, and
a control block configured to generate the termination resistance control signal based on the second clock signal, the third clock signal and the second ODT signal, and
wherein the control block includes a pipe line structure in a path of the second ODT signal, the pipe line structure changing in response to a frequency of the second clock signal.

2. The semiconductor device of claim 1, wherein the control block includes,
a pipe line control signal generator configured to generate a pipe line control signal, the pine line control signal changing in response to the frequency of the second clock signal and in response to the third clock signal,
a first pipe line circuit configured to receive the second ODT signal and the second clock signal, and to synchronize the second ODT signal with the second clock signal so as to output a third ODT signal,
a second pipe line circuit configured to output a fourth ODT signal based on the third clock signal, the third ODT signal, and the pipe line control signal, the second pipe line circuit having the pipe line structure that changes in response to the pipe line control signal,
a first repeater configured to enhance a current driving ability of the fourth ODT signal so as to generate a fifth ODT signal,
a second repeater configured to enhance a current driving ability of the third clock signal so as to generate a fourth clock signal, and
a third pipe line circuit configured to receive the fifth ODT signal and the fourth clock signal and to synchronize the fifth ODT signal with the fourth clock signal so as to generate the termination resistance control signal.

3. The semiconductor device of claim 2, wherein the pipe line control signal generator includes,
  a frequency detection circuit configured to detect the frequency of the second clock signal and to generate a frequency flag signal based on the detected frequency, and
  a first logical operator configured to perform a logical operation on the third clock signal and the frequency flag signal so as to generate the pipe line control signal.

4. The semiconductor device of claim 3, wherein the frequency detection circuit generates the frequency flag signal at a first logic level when the frequency of the second clock signal is lower than a reference frequency and generates the frequency flag signal at a second logic level when the frequency of the second clock signal is higher than the reference frequency.

5. The semiconductor device of claim 3, wherein the frequency detection circuit includes,
  a delay circuit configured to delay the second clock signal by a delay time so as to generate a fifth clock signal,
  a second logical operator configured to perform a logical operation on the second clock signal and the fifth clock signal,
  a third logical operator configured to invert or latch an output signal of the second logical operator in response to the second clock signal, and
  a fourth logical operator configured to invert or latch an output signal of the third logical operator in response to the second clock signal.

6. The semiconductor device of claim 5, wherein the second logical operator includes,
  a first NAND gate configured to perform the logical operation on the second clock signal and the fifth clock signal, and
  a first inverter configured to invert an output signal of the first NAND gate.

7. The semiconductor device of claim 5, wherein the third logical operator includes,
  a first switching element configured to switch in response to the second clock signal, and
  a first latch circuit configured to invert or latch an output signal of the first switching element in response to the second clock signal.

8. The semiconductor device of claim 5, wherein the fourth logical operator includes,
  a second switching element configured to switch in response to the second clock signal, and
  a second latch circuit configured to invert or latch an output signal of the second switching element in response to the second clock signal.

9. The semiconductor device of claim 3, wherein the first logical operator includes,
  a first NAND gate configured to perform the logical operation on the frequency flag signal and the third clock signal, and
  a first inverter configured to invert an output signal of the first NAND gate.

10. The semiconductor device of claim 2, wherein the second pipe line circuit includes,
  at least one first flip-flop configured to latch the third ODT signal or an output signal of a previous flip-flop in response to the third clock signal, and
  at least one second flip-flop configured to latch or invert the third ODT signal or an output signal of a previous flip-flop in response to the pipe line control signal.

11. The semiconductor device of claim 2, wherein each of the first repeater and the second repeater includes a plurality of inverters connected in series.

12. A method of operating a semiconductor device, the method comprising:
  generating a termination resistance control signal by changing a structure of a pipe line of an on-die termination (ODT) control circuit and passing a first ODT signal through the changed pipe line, and
  generating termination resistance in response to the termination resistance control signal, wherein generating the termination resistance control signal includes,
    buffering a first clock signal and outputting a second clock signal,
    receiving the first clock signal and outputting a third clock signal synchronized with the first clock signal,
    buffering the first ODT signal and outputting a second ODT signal, and
    generating the termination resistance control signal based on the second clock signal, the third clock signal, and the second ODT signal, and
      wherein the structure of the pipe line in a path of the second ODT signal changes in response to a frequency of the second clock signal.

13. The method of claim 12, wherein generating the termination resistance control signal based on the second clock signal, the third clock signal, and the second ODT signal includes,
  generating a pipe line control signal based on the second clock signal and the third clock signal,
  receiving the second ODT signal and the second clock signal and outputting a third ODT signal by synchronizing the second ODT signal with the second clock signal,
  outputting a fourth ODT signal based on the third clock signal, the third ODT signal, and the pipe line control signal and changing the structure of the pipe line in response to the pipe line control signal,
  generating a fifth ODT signal by enhancing a current driving ability of the fourth ODT signal,
  generating a fourth clock signal by enhancing a current driving ability of the third clock signal, and
  receiving the fifth ODT signal and the fourth clock signal and generating the termination resistance control signal by synchronizing the fifth ODT signal with the fourth clock signal.

14. The method of claim 13, wherein generating the pipe line control signal includes,
  detecting the frequency of the second clock signal and generating a frequency flag signal based on the detected frequency, and
  generating the pipe line control signal by performing a logical operation on the third clock signal and the frequency flag signal.

15. The method of claim 14, wherein generating the frequency flag signal includes,
  generating a fifth clock signal by delaying the second clock signal by a delay time,
  performing a logical operation on the second clock signal and the fifth clock signal,
  inverting or latching a result of the logical operation on the second clock signal and the fifth clock signal in response to the second clock signal, and
  inverting or latching the inverted or latched result of the logical operation in response to the second clock signal.

16. The method of claim 13, wherein changing the structure of the pipe line includes latching or inverting the third ODT signal or an output signal of a previous flip-flop in response to the pipe line control signal.

17. A system comprising:
- a clock generator for generating the first clock signal;
- a controller for generating the first ODT signal;
- a plurality of semiconductor devices, each of the plurality of semiconductor devices being a semiconductor device according to claim 1; and
- a data bus operating under the control of the controller.

18. The system of claim 17, wherein the controller generates the first ODT signal based on the first clock signal.

* * * * *